(12) United States Patent
Mineji et al.

(10) Patent No.: US 6,372,591 B1
(45) Date of Patent: Apr. 16, 2002

(54) FABRICATION METHOD OF SEMICONDUCTOR DEVICE USING ION IMPLANTATION

(75) Inventors: Akira Mineji; Seiichi Shishiguchi; Shuichi Saito, all of Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/203,820

(22) Filed: Dec. 2, 1998

(30) Foreign Application Priority Data

Dec. 3, 1997 (JP) ............................................. 9-332735

(51) Int. Cl.$^7$ ............................................. H01L 21/336

(52) U.S. Cl. ...................................... 438/305; 438/528

(58) Field of Search ................................ 438/231, 305, 438/592, 528, 301, 303, 197, 232

(56) References Cited

U.S. PATENT DOCUMENTS

| | | | | |
|---|---|---|---|---|
| 5,141,895 A | * | 8/1992 | Pfiester | 437/162 |
| 5,352,631 A | * | 10/1994 | Staram | 438/200 |
| 5,888,853 A | * | 3/1999 | Gardener | 438/152 |
| 5,969,407 A | * | 10/1999 | Gardener | 257/607 |
| 5,970,353 A | * | 10/1999 | Sultan | 438/302 |
| 5,972,760 A | * | 10/1999 | Ju | 438/305 |
| 5,998,272 A | * | 12/1999 | Ishida | 438/305 |
| 6,008,098 A | * | 12/1999 | Pramanick | 438/305 |
| 6,030,863 A | * | 2/2000 | Chang | 438/229 |
| 6,037,204 A | * | 3/2000 | Chang | 438/231 |
| 6,051,863 A | * | 4/2000 | Hause | 257/369 |
| 6,069,044 A | * | 5/2000 | Wu | 438/299 |
| 6,087,209 A | * | 7/2000 | Yeap | 438/197 |
| 6,100,171 A | * | 8/2000 | Ishida | 438/535 |
| 6,156,613 A | * | 12/2000 | Wu | 438/300 |

FOREIGN PATENT DOCUMENTS

| | | | | |
|---|---|---|---|---|
| JP | 1-120015 | 5/1989 | ............ | H01L/21/22 |
| JP | 3131020 | 6/1991 | ......... | H01L/21/265 |
| JP | 3-174721 | 7/1991 | ......... | H01L/21/265 |
| JP | 4196525 | 7/1992 | ......... | H01L/21/265 |
| JP | 5-275362 | 10/1993 | ......... | H01L/21/265 |
| JP | 6-252087 | 9/1994 | ......... | H01L/21/265 |
| JP | 6-267881 | 9/1994 | ......... | H01L/21/265 |
| JP | 8-181085 | 7/1996 | ......... | H01L/21/265 |
| JP | 9-199719 | 7/1997 | ............ | H01L/29/78 |

* cited by examiner

*Primary Examiner*—Mary Wilczewski
(74) *Attorney, Agent, or Firm*—Hayes, Soloway, Hennessey, Grossman & Hage, P.C.

(57) ABSTRACT

A fabrication method of a semiconductor device is provided, which makes it possible to form shallow extensions (e.g., 0.1 μm or less in depth) of source/drain regions of a MOSFET with a double drain structure. In the step (a), a gate electrode is formed over a main surface of a single-crystal Si substrate of a first conductivity type through a gate insulating film. In the step (b), a dopant of a second conductivity type is ion-implanted into the substrate at an acceleration energy of 1 keV or lower under a condition that the amount of point defects induced in this step (b) is minimized or decreased, thereby forming first and second doped regions of the second conductivity type. In the step (c), a pair of sidewalls spacers are formed. In the step (d), a dopant of the second conductivity type is ion-implanted into the substrate, thereby forming third and fourth doped regions of the second conductivity type having a depth greater than the first and second doped regions and a lower dopant concentration than the first and second doped regions to be overlapped therewith. In the step (e), the substrate is subjected to an annealing process, thereby constituting one of a pair of source/drain regions with a double drain structure by the first and third doped regions and the other thereof by the second and fourth doped regions.

12 Claims, 5 Drawing Sheets

FABRICATION METHOD OF SEMICONDUCTOR DEVICE USING ION IMPLANTATION

BACKGROUND OF THE INVENTION

1. Field of the Invention

The present invention relates to a fabrication method of a semiconductor device and more particularly, to a fabrication method of a semiconductor device using an ion-implantation technique, which is applicable to formation of shallow source/drain regions (e.g., 0.1 µm or less in depth) of a Metal-Oxide-Semiconductor Field-Effect Transistor (MOSFET) with the double drain structure.

2. Description of the Prior Art

In recent years, semiconductor devices have been becoming miniaturized more and more according to the increase in their integration scale. Under such the circumstances, a lot of electronic devices such as memory or logic devices have been integrated on a semiconductor substrate or chip. In these highly-integrated semiconductor devices, i.e., Large-scale Integrated circuits (LSIs), typically, n- and p-channel MOSFETs are used to constitute the Complementary MOS (CMOS) structure.

To cope with the progressing miniaturization and increasing integration tendency, there has been the need to solve the problems induced by the short-channel effects in MOSFETs. A known solution to the problems is to decrease the depth of source/drain regions of the MOSFETs (i.e., to use shallow source/drain regions). However, the depth decrease of the source/drain regions causes another problem that the sheet resistance of the source/drain regions is increased and simultaneously, the contact resistance of the source/drain regions with overlying wiring materials is also increased.

Another known solution to the above problems is to use the double drain structure of the source/drain regions of the MOSFET, where each of the source/drain region is formed by two parts, i.e., a shallow and high doping-concentration part located near the gate electrode and a deep and low doping-concentration part located apart from the gate electrode. The shallow and high doping-concentration part, which is located below a sidewall spacer of the gate electrode, is termed the "extension" of the source/drain region.

The shallow and high doping-concentration part contributes to the depth decrease in a source/drain region and at the same time, the deep and low doping-concentration part serves to prevent the sheet resistance and contact resistance of the souce/drain region from increasing. Accordingly, the double drain structure not only contributes to improvement in the driving capability of the MOSFET but also solves the above-described problem of the sheet resistance increase and the contact resistance increase of the source/drain region.

Recently, as a new doping method to form shallow p-n junctions or shallow source/drain regions (e.g., 0.1 µm or less in depth), solid-phase diffusion, gas-phase diffusion, plasma doping, and laser doping methods have been developed and examined. These new methods are especially effective in the doping process of boron (B) that has been usually employed as a p-type dopant in the silicon LSIs. Each of these new methods serves as an alternative of the popular ion-implantation method. This is because boron has a small mass and a high diffusion rate in silicon (Si) and as a result, shallow boron-doped regions are difficult to be formed by the popular ion-implantation method.

Thus, the popular ion-implantation method has a disadvantage that shallow doped regions or shallow p-n junctions (e.g., 0.1 µm or less in depth) are difficult to be formed. This is caused by the following main reason.

Specifically, due to the ion-implantation process of a dopant, crystal defects termed the point defects such as vacancies and interstitial atoms of Si are induced in a single-crystal Si substrate. Since the implantation-induced point defects enhances the diffusion of the implanted dopant atoms, the resultant profile and concentration of the implanted dopant atoms tend to deviate from its desired profile and concentration through a subsequent annealing process for the activation purpose.

On the other hand, the popular ion-implantation method has an advantage that the uniformity, reproducibility, controllability, and throughput are better than those of the above-identified new doping methods, i.e., the solid-phase diffusion, gas-phase diffusion, plasma doping, and laser doping methods, in the case of formation of the source/drain regions of the MOSFET. Therefore, if the generation of the implantation-induced point defects is suppressed and at the same time, the enhanced diffusion phenomenon of the dopant atoms occurring in the annealing process is well controlled, it is expected that the ion-implantation method is able to fully cope with fabrication of the future LSIs.

Additionally, the enhanced diffusion of the implanted dopant atoms, which is one of the disadvantages of the ion-implantation method, affects not only the implanted dopant atoms for the source/drain regions but also the dopant atoms existing in the channel region of the MOSFET.

For example, when the souce/drain regions with the double drain structure are formed, the deep and low doping-concentration parts of the source/drain regions, which are located apart from the gate electrode, need to have a depth enough for preventing the sheet resistance and the leakage current from increasing after (i) the silicidation process of the source/drain regions using a refractory metal such as titanium (Ti) and (ii) the formation process of the contact regions with an overlying wiring metal film. As a consequence, to form the deep and low doping-concentration parts, the same dopant as that of the shallow and high doping-concentration parts is selectively ion-implanted into the Si substrate. This ion-implantation process for the deep and low doping-concentration parts is carried out after the shallow and high doping-concentration parts (which are termed the "extensions" and located near the gate electrode) have been formed by selective ion-implantation and then, a pair of sidewall spacers have been formed at each side of the gate electrode.

In this case, the implanted dopant atoms existing in the shallow and high doping-concentration parts (i.e., the extensions) tends to be affected by the enhanced diffusion phenomenon of the implanted dopant atoms into the deep and low doping-concentration parts. This leads to the short-channel effects. Also, the distribution of the dopant atoms existing in the channel region may be affected by the same enhanced diffusion phenomenon.

Accordingly, to improve the controllability of the profile and concentration of the implanted dopant atoms in the source/drain regions with the double drain structure, it is important to control the enhanced diffusion phenomenon of the implanted dopant atoms into the deep and low doping-concentration parts. In other words, it is effective to find the ion-implantation condition minimizing or decreasing the generation of the implantation-induced crystal defects in the Si substrate.

Conventionally, as an improvement of the ion-implantation method to form the shallow junctions of the source/drain regions, the "preamorphized ion-implantation" method has been developed. In this improved method, to prevent the channeling phenomenon of the implanted boron atoms from occurring, the main surface of a single-crystal Si substrate is amorphized by an ion-implantation process of germanium (Ge) or Si to thereby form an amorphous region at the implanted main surface of the substrate prior to an ion-implantation process of boron (B). This is because the implanted boron atoms tend to be reached to a deeper level than their actual projected range in the Si substrate due to the channeling phenomenon because of its small mass. Due to the amorphous region thus formed, the channeling phenomenon of the boron atoms is effectively prevented.

With the conventional preamorphized ion-implantation method, as described above, the channeling phenomenon of the implanted boron atoms is effectively prevented. However, point defects are induced in the amorphous region by the preamorphizing ion-implantation process of Ge or Si. Accordingly, there is a disadvantage that the enhanced diffusion phenomenon of the implanted boron atoms is not prevented from occurring in the amorphous region in the subsequent annealing process, resulting in deviation in the profile and doping concentration.

Also, if boron is ion-implanted into the Si substrate at the same acceleration energy, the depth of a boron-doped region obtained by the use of the preamorphization process is shallower than that obtained by the use of no preamorphization process. However, there arises another disadvantage that the resultant depth of the boron-doped region in the former case (i.e., using the preamorphization process) may be approximately equal to that in the latter case (without the preamorphization process) due to the enhanced diffusion after an annealing process for activation has been completed. As a consequence, the condition for these two ion-implantation processes needs to be optimized for the purpose of formation of shallow source/drain regions.

As explained above, to form shallow source/drain regions (e.g., 0.1 $\mu$m or less in depth) of a miniaturized MOSFET according to the design with good controllability, first, the enhanced diffusion phenomenon of the implanted dopant atoms needs to be well controlled.

Second, since the dopant distributions of the well regions and the channel regions may be changed by the effect of the enhanced diffusion phenomenon, the distribution of the implantation-induced point defects also needs to be well controlled.

SUMMARY OF THE INVENTION

Accordingly, an object of the present invention to provide a fabrication method of a semiconductor device that makes it possible to form shallow source/drain regions (e.g., 0.1 $\mu$m or less in depth) of a miniaturized MOSFET with good controllability, thereby preventing the short-channel effects from occurring.

Another object of the present invention is to provide a fabrication method of a semiconductor device that makes it possible to well control the enhanced diffusion phenomenon of the implanted dopant atoms and the implantation-induced point defects.

Still another object of the present invention is to provide a fabrication method of a semiconductor device that makes it possible to form shallow extensions (e.g., 0.1 $\mu$m or less in depth) of source/drain regions of a MOSFET with a double drain structure without characteristic degradation of a gate insulating film.

The above objects together with others not specifically mentioned will become clear to those skilled in the art from the following description.

According to a first aspect of the present invention, a fabrication method of a semiconductor device is provided, which is comprised of a step of ion-implanting a dopant of a conductivity type into a single-crystal Si substrate of an opposite conductivity type to that of the dopant to form source/drain regions of a MOSFET at an acceleration energy of 1 keV or lower. This step is carried out under a condition that the amount of point defects induced in the substrate by this ion-implantation step is minimized or decreased.

With the fabrication method of a semiconductor device according to the first aspect, since the acceleration energy of the ion-implantation step is set as 1 keV or lower, shallow source/drain regions having a depth of 0.1 $\mu$m or less of a miniaturized MOSFET can be formed.

Also, the enhanced diffusion phenomenon of the implanted dopant is caused by the implantation-induced point defects. From this viewpoint, since the ion-implantation step is carried out under a condition that the amount of point defects induced in the substrate by this ion-implantation step is minimized or decreased, the enhanced diffusion phenomenon can be minimized or suppressed. In other words, the enhanced diffusion phenomenon of the implanted dopant atoms and the implantation-induced point defects can be well controlled.

Accordingly, the profile and the doping concentration of shallow source/drain regions having a depth of 0.1 $\mu$m or less can be determined with good controllability. As a consequence, the short-channel effects can be prevented from occurring.

In the fabrication method of a semiconductor device according to the first aspect, a dose of the dopant in the ion-implantation step is optionally determined according to a desired doping characteristic of the shallow source/drain regions.

As the dopant, any p- or n-type dopant element may be used. However, boron (B) is preferably used, because the advantage of the present invention is effectively exhibited in this case.

The limitation that the amount of point defects induced in the substrate by this ion-implantation step is minimized or decreased has a typical meaning that the amount of the implantation-induced point defects is set as low as possible. For example, when the acceleration energy of the ion-implantation step is set as 1 keV or lower, addition of the amorphization process extends the enhanced diffusion length of the implanted dopant. Therefore, in this case, it is preferred that the above-identified ion-implantation step is carried out with no amorphization process.

According to a second aspect of the present invention, a fabrication method of a semiconductor device having a MOSFET with a double drain structure is provided, which is comprised of the steps (a) to (e).

In the step (a), a gate electrode is formed over a main surface of a single-crystal Si substrate of a first conductivity type through a gate insulating film.

In the step (b), a dopant of a second conductivity type opposite in polarity to the first conductivity type is ion-implanted into the substrate at an acceleration energy of 1 keV or lower in self-alignment to the gate electrode under a condition that the amount of point defects induced in this step (b) is minimized or decreased, thereby forming first and second doped regions of the second conductivity type at each side of the gate electrode.

In the step (c), a pair of sidewalls spacers are formed on the substrate at each side of the gate electrode.

In the step (d), a dopant of the second conductivity type is ion-implanted into the substrate in self-alignment to the pair of sidewall spacers, thereby forming third and fourth doped regions of the second conductivity type at each side of the gate electrode to be partially overlapped with the first and second doped regions, respectively.

The third and fourth doped regions have a depth greater than that of the first and second doped regions and a lower dopant concentration than that of the first and second doped regions.

In the step (e), the substrate having the first, second, third, and fourth doped regions of the second conductivity type is subjected to a heat treatment for annealing, thereby constituting one of a pair of source/drain regions with a double drain structure by the first and third doped regions and the other thereof by the second and fourth doped regions.

With the fabrication method of a semiconductor device according to the second aspect, in the step (b), the first and second doped regions of the second conductivity type are formed by ion implantation at an acceleration energy of 1 keV or lower. Therefore, the first and second doped regions have a depth of 0.1 µm or less.

Also, since the ion implantation in the step (b) is carried out under the condition that the amount of point defects induced in this step (b) is minimized or decreased, the enhanced diffusion phenomenon can be minimized or suppressed. In other words, the enhanced diffusion phenomenon of the implanted dopant atoms and the implantation-induced point defects can be well controlled. Accordingly, the profile and the doping concentration of first and second shallow doped regions having a depth of 0.1 µm or less can be determined with good controllability. As a consequence, the short-channel effects can be prevented from occurring.

Further, the ion implantation in the step (d) is carried out in such a way that the third and fourth doped regions have a depth greater than that of the first and second doped regions and a lower dopant concentration than that of the first and second doped regions. Therefore, the third and fourth doped regions having a depth greater than 0.1 µm constitute the pair of source/drain regions with a double drain structure together with the first and second doped regions having a depth of 0.1 µm or less. This means that the pair of source/drain regions have shallow extensions of 0.1 µm or less in depth.

Additionally, because the ion implantation in the step (b) is carried out at an acceleration energy of 1 keV or lower, the gate insulating film is scarcely damaged by this ion implantation. Also, the ion implantation in the step (d) is carried out at a higher acceleration energy than that in the step (b). However, this ion-implantation step (d) is carried out in self-alignment of the pair of sidewall spacers and as a result, the gate insulating film is not damaged by this ion implantation. Consequently, the characteristic of the gate insulating film does not degrade.

In a preferred example of the fabrication method of a semiconductor device according to the second aspect, a step of amorphizing the main surface of the substrate is added to form an amorphous region prior to or next to the step (d) of ion implantation to form the third and fourth doped regions. In this case, since the channeling phenomenon of the implanted dopant is prevented from occurring, there is an additional advantage that the enhanced diffusion phenomenon of the implanted dopant is suppressed.

It is preferred that the amorphous region formed at the main surface of the substrate contains vacancies only as crystal defects, and that the amorphous region is located in a point-defect region containing both of interstitial atoms of Si and vacancies as crystal defects. In this case, by the formation of the amorphous region, the interstitial atoms of Si affecting mainly to the enhanced diffusion phenomenon of the dopant and existing in the point-defect region are eliminated. Therefore, there is an additional advantage that the enhanced diffusion phenomenon of the dopant is further suppressed.

In another preferred example of the fabrication method of a semiconductor device according to the second aspect, a projected range of the dopant and a region having a doping concentration of $1 \times 10^{20}$ atoms/cm$^3$ or greater are included in the amorphous region. Also, a bottom of the point-defect region is located at a level lower than that of an interface between the amorphous region and the remaining single-crystal region of the substrate. In other words, a p-n junction defined by the point-defect region and the remaining single-crystal region of the substrate is located in the remaining single-crystal region of the substrate.

In this case, if the region having a doping concentration of $1 \times 10^{20}$ atoms/cm$^3$ or greater is not included in the amorphous region, (in other words, this region is extended to the remaining single-crystal region of the substrate,) point defects are induced in the remaining single-crystal region of the substrate due to the ion-implantation of the dopant. Due to the induced point defects, the suppression of the enhanced diffusion phenomenon is not effectively realized.

Since the p-n junction defined by the point-defect region and the remaining single-crystal region of the substrate is located in the remaining single-crystal region of the substrate, the current leakage is suppressed more effectively. If this p-n junction is not located in the remaining single-crystal region of the substrate, the p-n junction is located in the amorphous region where the vacancy-type crystal defects tend to be left in the amorphous region even after the annealing step (e). The remaining crystal defects serve to increase the current leakage.

Typically, the ion-implantation process of the dopant to form the source/drain regions is carried out with a dose of $1 \times 10^{14}$ to $5 \times 10^{15}$ atoms/cm$^2$. If the dose is greater than a specific value in the range of $1 \times 10^{14}$ to $5 \times 10^{15}$ atoms/cm$^2$, the main surface of the Si substrate is usually amorphized due to the ion implantation of the dopant. However, if boron is used as the dopant, the main surface of the Si substrate is not amorphized because of the small mass of boron.

Moreover, as the point defects causing the enhanced diffusion phenomenon, vacancy-type defects and interstitial atom-type defects has been known. It has been thought that the interstitial atom-type defects has a larger effect to the enhanced diffusion phenomenon than the vacancy-type defects.

In the amorphous region of the Si substrate formed by the amorphization process, only the vacancy-type defects exist. Therefore, only the part of the point-defect region located lower than the bottom of the amorphous region serves as the cause to the enhanced diffusion phenomenon.

The distribution of the implantation-induced point defects such as the vacancy-type and interstitial atom-type defects varies according to the kind of the dopant, the acceleration energy, and the dose. Also, the optimum condition to suppress the generation of the point defects (i.e., the acceleration energy and the dose) is changed dependent upon the kind of the dopant. Accordingly, even if a case where the dopant is ion-implanted without any amorphization process and another case where the dopant is ion-implanted with an amorphization process are simply compared together under a specific implantation condition, it cannot be said whether either of the two cases is advantageous for the purpose of suppressing the amount of the induced point defects.

In the method according to the second aspect, any p- or n-type dopant element may be used as the dopant. However, boron (B) is preferably used, because the advantage of the present invention is effectively exhibited in this case.

DETAILED DESCRIPTION OF THE INVENTION

To cope with the above-described needs to control the enhanced diffusion phenomenon of the implanted dopant atoms and the distribution of the implantation-induced point defects, the inventors enthusiastically made research and development concerning the ion implantation process for this purpose. As a result of this, they created the present invention.

To observe the enhanced diffusion phenomenon of implanted boron (B) atoms within a single-crystal Si substrate, the inventors carried out some tests in the following way.

First, n-type single-crystal Si substrates 1 were prepared. Each of the substrates 1 had a δ doped layer 2 of boron serving as a marker layer for this observation in its inside. The δ doped layer 2 of boron was formed to extend in parallel to a main surface of the substrate 1.

Next, boron was ion-implanted into the single-crystal Si substrates 1 under different conditions.

With a first specimen, boron was ion-implanted into the substrate 1 at an acceleration energy of 2 keV with a dose of $1 \times 10^{15}$ atoms/cm$^2$. No preamorphization process was added.

Figure 1A:
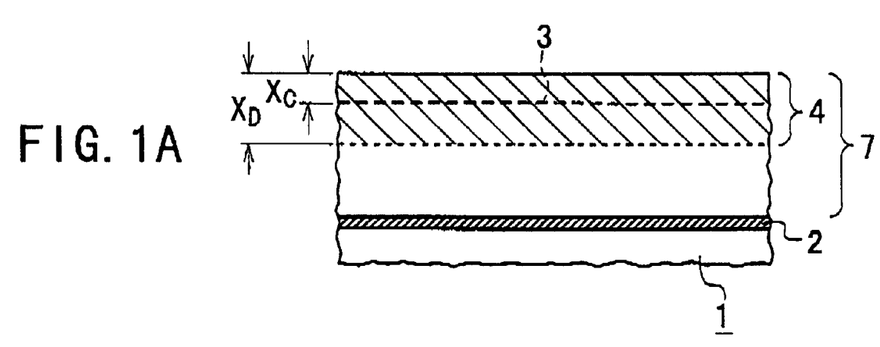
FIG. 1A is a schematic, partial cross-sectional view of a single-crystal Si substrate, which shows the state of the inside of the substrate in the first specimen according to the present invention after the ion-implantation process of boron.

In the first specimen thus formed, the substrate 1 had a cross section shown in FIG. 1A. In FIG. 1A, the reference numeral 3 denotes the level from the main surface of the substrate 1 at which the boron concentration is equal to $1 \times 10^{20}$ atoms/cm$^3$. The reference numeral 4 denotes a point-defect region containing point defects generated by the ion implantation process of boron. The reference numeral 7 denotes a single-crystal region of the substrate 1.

In the first specimen, as seen from FIG. 1A, the whole point-defect region 4 is located in the single-crystal region 7 of the substrate 1, because no amorphous region was formed at the main surface of the substrate 1. The point-defect region 4 was comparatively wide.

Also, as seen from FIG. 1A, the level of the δ doped layer 2 of boron was deeper than that of the bottom of the point-defect region 4. The level 3 with the boron concentration of $1 \times 10^{20}$ atoms/cm$^3$ had a depth $X_C$ less than a depth $X_D$ of the point-defect region 4 and as a result, the level 3 was located in the point-defect region 4.

With a second specimen, to preamorphize the main surface of the substrate 1, germanium (Ge) was ion-implanted into the substrate 1 at an acceleration energy of 5 keV with a dose of $1 \times 10^{15}$ atoms/cm$^2$. Thereafter, an ion-implantation process of boron was carried out at a same acceleration energy as that of the first specimen and with a same dose as that of the first specimen.

Figure 1B:
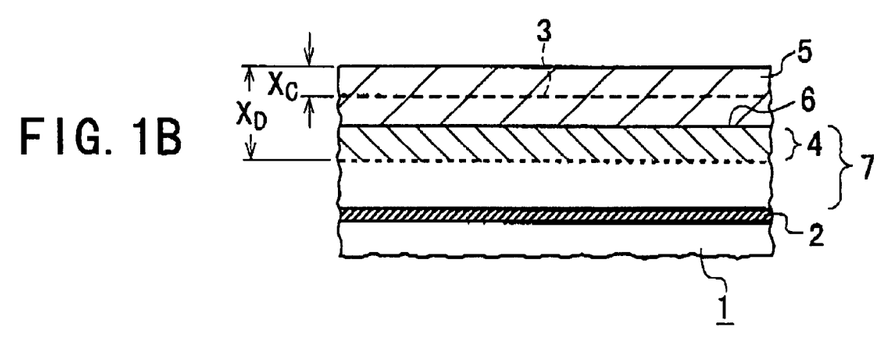
FIG. 1B is a schematic, partial cross-sectional view of a single-crystal Si substrate, which shows the state of the inside of the substrate in the second specimen according to the present invention after the ion-implantation process of boron.

In the second specimen thus formed, the substrate 1 had a cross section shown in FIG. 1B. As seen from FIG. 1B, similar to the first specimen, the level of the δ doped layer 2 of boron was deeper than the bottom of the point-defect region 4.

However, unlike the first specimen, due to the ion-implantation of germanium, an amorphous region 5 was formed at the main surface of the substrate 1. In other words, the upper part of the point-defect region 4 was converted to the amorphous region 5 while the lower part of the point-defect region 4 was left unchanged. Thus, the resulting or remaining point-defect region 4 was located below the amorphous region 5.

The level 3 with the boron concentration of $1 \times 10^{20}$ atoms/cm$^3$, which had a same depth $X_C$ as that of the first specimen, was located in the amorphous region 5. An amorphous/crystal (A/C) interface 6 was formed at the boundary of the remaining single-crystal region 7 of the substrate 1.

Also, due to the amorphous region 5 thus formed, the single-crystal region 7 was limited below the A/C interface 6 and at the same time, the remaining point-defect region 4 was located below the amorphous region 5 in contact with the amorphous/crystal interface 6. The bottom of the point-defect region 4 was apart from the δ doped layer 2 of boron.

The depth $X_D$ of the point-defect region 4 was greater than that of the first specimen because of the following reason.

Specifically, the acceleration energy of germanium was higher than that of boron and therefore, the bottom of the point-defect region 4 was determined by the ion-implantation of germanium for preamorphization. As a result, the depth $X_D$ of the point-defect region 4 in the second specimen was greater than that in the first specimen.

Typically, the amorphous region 5 contains only the vacancy-type crystal defects applying no effect to the enhanced diffusion phenomenon of the implanted boron atoms. On the other hand, the volume of the point-defect region 4, which contained not only the vacancy-type crystal defects but also the interstitial atom-type crystal defects applying a large effect to the enhanced diffusion phenomenon of the implanted boron atoms, was decreased by the amorphous region 5. Therefore, the total amount of the interstitial atom-type crystal defects in the substrate 1 was lower than that of the first specimen.

With a third specimen, to preamorphize the main surface of the substrate 1, germanium was ion-implanted into the substrate 1 at a same acceleration energy as that of the second specimen with a same dose as that of the second specimen. Thereafter, an ion-implantation process of boron was carried out at an acceleration energy of 3.3 keV higher than the first specimen with a same dose as that of the first specimen.

Figure 1C:
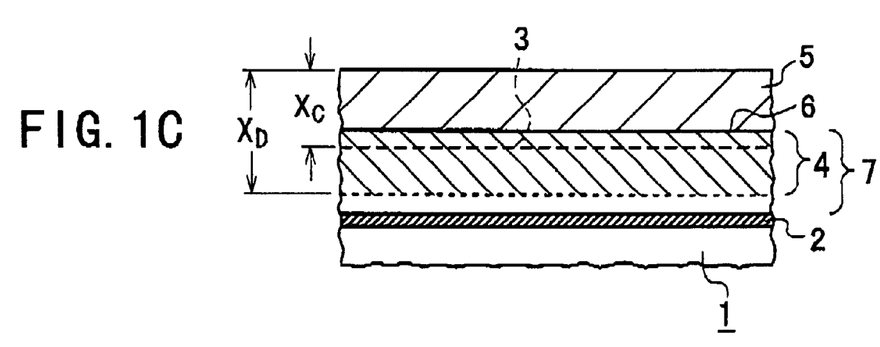
FIG. 1C is a schematic, partial cross-sectional view of a single-crystal Si substrate, which shows the state of the inside of the substrate in the third specimen according to the present invention after the ion-implantation process of boron.

In the third specimen thus formed, the substrate 1 had a cross section shown in FIG. 1C. As seen from FIG. 1C, similar to the first and second specimens, the level of the δ doped layer 2 of boron was deeper than the bottom of the point-defect region 4.

Similar to the second specimen, due to the ion-implantation of germanium, an amorphous region 5 was formed at the main surface of the substrate 1, and an amorphous/crystal (A/C) interface 6 was formed at the boundary of the remaining single-crystal region 7. The depth of the amorphous region 5 was equal to that of the second specimen.

However, unlike the second specimen, the level 3 with the boron concentration of $1 \times 10^{20}$ atoms/cm$^3$ was located not in the amorphous region 5 but in the point-defect region 4. In other words, the level 3 with the boron concentration of $1 \times 10^{20}$ atoms/cm$^3$ had a depth $X_C$ greater than that of the second specimen. This was because the acceleration energy (=3.3 keV) of boron was higher than that of the second specimen.

The depth $X_D$ of the point-defect region 4 was greater than that of the second specimen, because the acceleration energy (=3.3 keV) of boron was higher than that of the second specimen.

Also, due to the amorphous region 5 thus formed, the single-crystal region 7 was limited below the A/C interface 6. The point-defect region 4 was located between the amorphous region 5 in contact with the amorphous/crystal interface 6. The bottom of the point-defect region 4 was apart from the δ doped layer 2 of boron by a shorter length than the second specimen.

Figure 2:
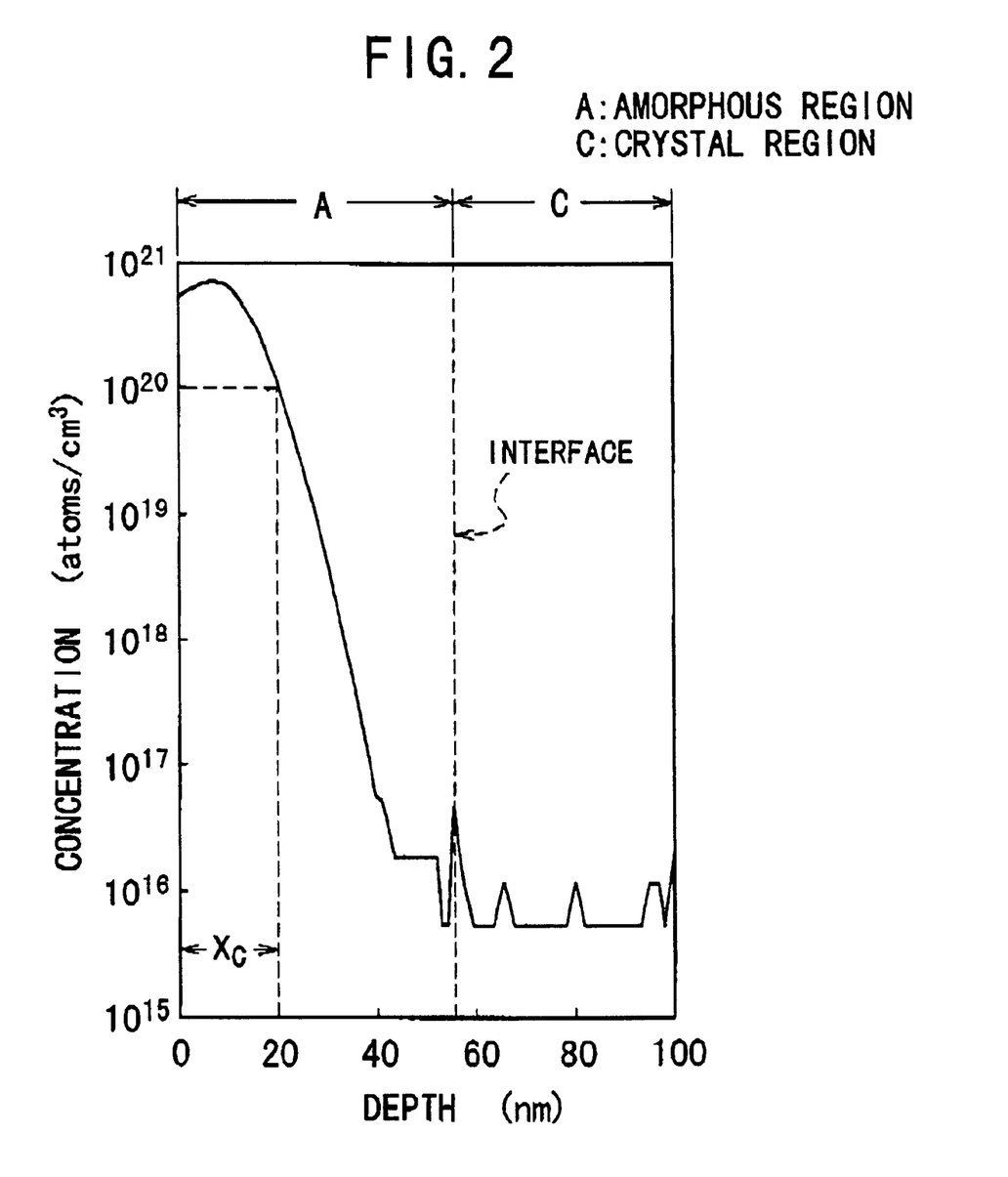
FIG. 2 is a graph showing the boron concentration change of the second specimen shown in FIG. 1B as a function of the depth from the main surface of the substrate.

FIG. 2 shows the boron concentration change of the second specimen shown in FIG. 1B as a function of the depth from the main surface of the substrate 1.

As seen from FIG. 2, the depth $X_C$ of the level 3 with the boron concentration of $1 \times 10^{20}$ atoms/cm$^3$ was 20 nm in the second specimen.

After the ion-implantation process of boron, the first, second, and third specimens were subjected to a Rapid Thermal Annealing (RPA) process under a same condition that the annealing temperature was set as 950° C. and the annealing time was set as 10 seconds.

Figure 3:
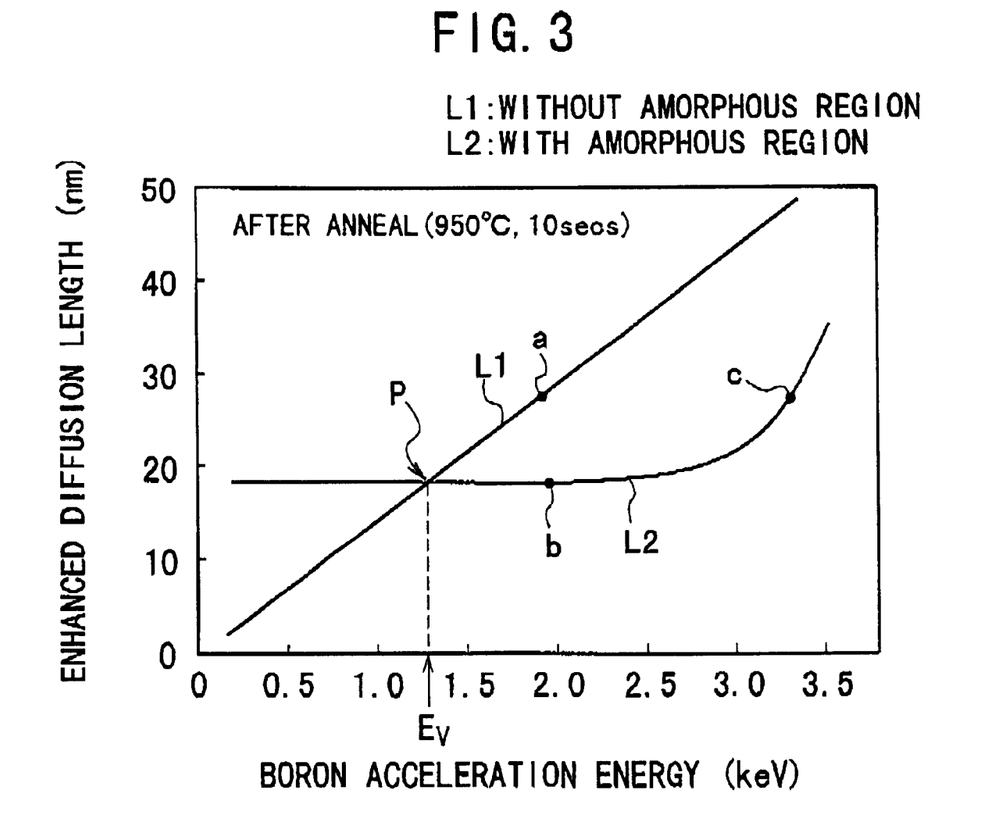
FIG. 3 is a graph showing the change of the enhanced diffusion length of the ion-implanted boron as a function of the acceleration energy depth from the main surface of the substrate, which was obtained by the inventors' tests.

FIG. 3 shows the change of the enhanced diffusion length of the ion-implanted boron as a function of the acceleration energy depth from the main surface of the substrate 1.

In FIG. 3, the curve 11 denotes the cases where the amorphous region 5 was not formed and the curve L2 denotes the cases where the amorphous region 5 was formed. The points a, b, and c correspond to the first, second, and third specimens, respectively. The curves L1 and L2 were obtained by the inventors' tests by the use of the first to third specimens and similar specimens (not explained here).

As seen from the curve L1 in FIG. 3, in the cases where no preamorphization process was carried out, the enhanced diffusion length increases almost linearly with the increasing acceleration energy of boron. On the other hand, as seen from the curve L2 in FIG. 3, in the cases where the preamorphization process was carried out, the enhanced diffusion length are approximately kept at a constant value defined by the ion-implantation condition of the preamorphization process as long as the depth $X_C$ of the level 3 with the boron concentration of $1 \times 10^{20}$ atoms/cm$^3$ is not deeper than the amorphous region 5.

The curves L1 and L2 are intersected at the position P where the acceleration energy of boron is approximately 1.3 keV.

It is essential that the ion-implantation condition of the preamorphization process is determined in such a way that the p-n junction of the boron-doped region exists in the single-crystal region 7 (i.e., in the point-defect region 4), in other words, the depth $X_j$ of the p-n junction of the boron-doped region is greater than the depth of the A/C interface 6. The reason is as follows.

Specifically, the crystal defects tend to be left in the amorphous region 5 after the RPA process. Therefore, if the p-n junction of the boron-doped region exists in the amorphous region 5, in other words, the p-n junction of the boron-doped region is located in the level shallower than the A/C interface 6, the remaining crystal defects tend to exist in the boron-doped region. The remaining crystal defects constitute a cause of current leakage at the p-n junction.

It is seen from the above-described test results with respect to the first to third specimens and other unexplained specimens that the effect applied to the enhanced diffusion phenomenon of the implanted boron atoms into the single-crystal Si substrate 1 by the implantation-induced point defects becomes weaker according to the decreasing acceleration energy of boron.

It is also seen from the same test results that the effect applied to the enhanced diffusion phenomenon of the implanted boron atoms into the single-crystal Si substrate 1 by the implantation-induced point defects may be weaker by addition of the preamorphization process if the acceleration energy of boron is suitably selected.

BRIEF DESCRIPTION OF THE DRAWINGS

In order that the present invention may be readily carried into effect, it will now be described with reference to the accompanying drawings.

EXAMPLES

By using the following examples of the present invention, the present invention will be described in detail below.

In this example, a semiconductor device is equipped with a p-channel MOSFET having a double drain structure.

Figure 4A:
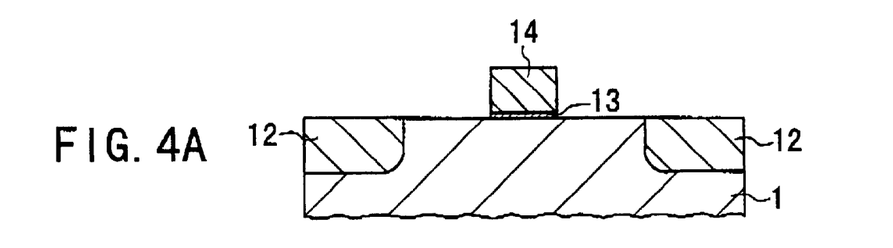
FIGS. 4A to 4F are schematic, partial cross-sectional views of a single-crystal Si substrate, which shows the steps of a fabrication method of a semiconductor device with a MOSFET according to an embodiment of the present invention.

First, as shown in FIG. 4A, a field oxide 12 was selectively formed on a main surface of an n-type single-crystal Si substrate 1 to define an active region. Then, a gate oxide 13 was formed on the main surface of the substrate 1 in the active region. A polysilicon film (not shown) was deposited to be patterned, thereby forming a polysilicon gate electrode 14 on the gate oxide 13.

Figure 4B:
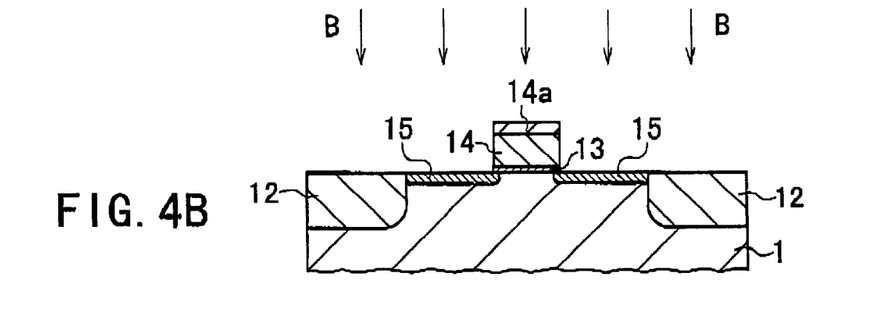

Next, to form shallow p-n junctions of source/drain regions with a depth less than 50 nm, boron was ion-implanted into the substrate 1 in self-alignment to the gate electrode 14 and the field oxide 12 at an acceleration energy of 0.2 keV with a dose of $1 \times 10^{15}$ atoms/cm$^2$. Thus, a pair of shallow boron-doped regions 15 were formed at each side of the gate electrode 14, as shown in FIG. 4B. At the same time as this, boron was ion-implanted into the top of the polysilicon gate electrode 14 and therefore, a boron-doped region 14a was formed in the top of the gate electrode 14.

Figure 4C:
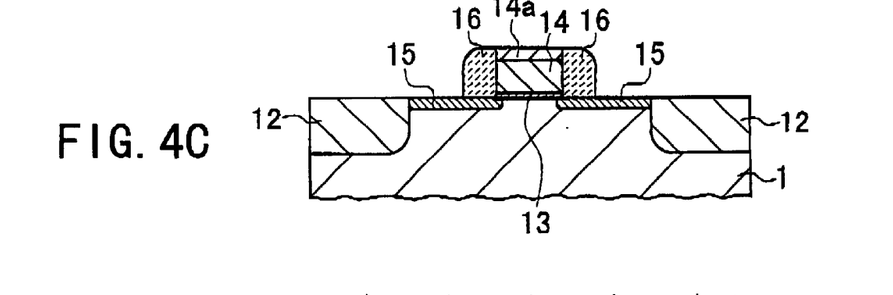

Then, as shown in FIG. 4C, a pair of dielectric sidewall spacers 16 were formed on the substrate 1 at each side of the gate electrode 14 by the use of a silicon dioxide ($SiO_2$) or silicon nitride ($Si_3O_4$) film. This sidewall-formation process was carried out at a temperature of 700° C. or lower in order to prevent the implanted boron into the substrate 1 from diffusing.

Figure 4D:
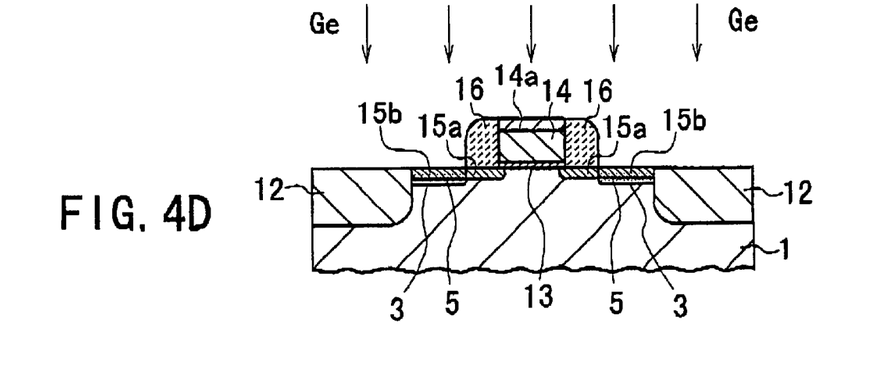

Subsequently, to form deep p-n junctions of source/drain regions with a depth greater than 0.1 μm (=100 nm), germanium was ion-implanted into the substrate 1 to be overlapped with the shallow boron-doped regions 15 in self-alignment to the gate electrode 14, the pair of sidewall spacers 16, and the field oxide 12 for the preamorphization purpose at an acceleration energy of 5 keV with a dose of $1 \times 10^{15}$ atoms/cm$^2$, as shown in FIG. 4D. Thus, the uncovered main surface of the substrate 1 was amorphized, thereby forming amorphous regions 15b and remaining single-crystal regions 15a.

Figure 4E:
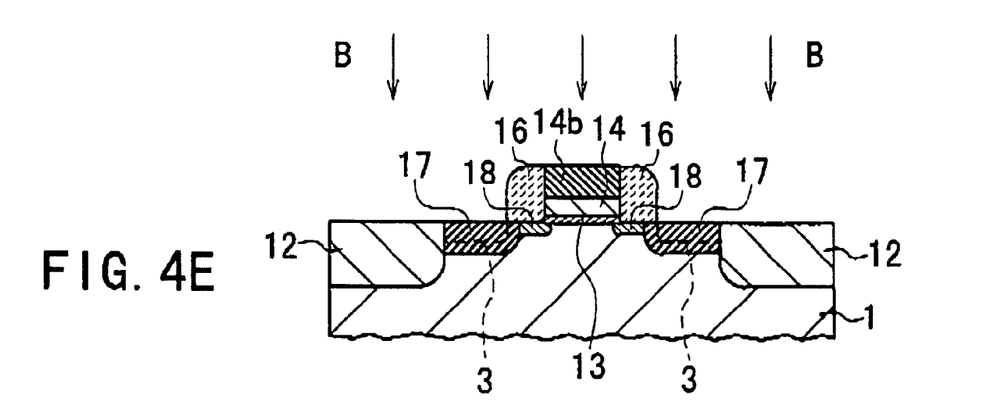

Following this preamorphization process of Ge, boron was ion-implanted into the substrate 1 to be overlapped with the amorphous regions 15b in self-alignment to the gate electrode 14, the pair of sidewall spacers 16, and the field oxide 12 at an acceleration energy of 2 keV with a dose of $1 \times 10^{15}$ atoms/cm$^2$, as shown in FIG. 4E. Thus, a pair of deep boron-doped regions 17 were formed at each side of the gate electrode 14 and a pair of shallow boron-doped regions (i.e., the extensions) 18 were formed below the pair of sidewall spacers 16. The doping concentration of the pair of deep boron-doped regions 17 was lower than that of the pair of shallow boron-doped regions (i.e., the extensions) 18.

At the same time as this, boron was further ion-implanted into the polysilicon gate electrode 14 and therefore, a thicker boron-doped region 14b than the boron-doped region 14a was formed in the gate electrode 14.

Finally, the substrate 1 was subjected to a RPA process at a temperature of 800° C. for 10 seconds using a lamp annealer apparatus.

Figure 4F:
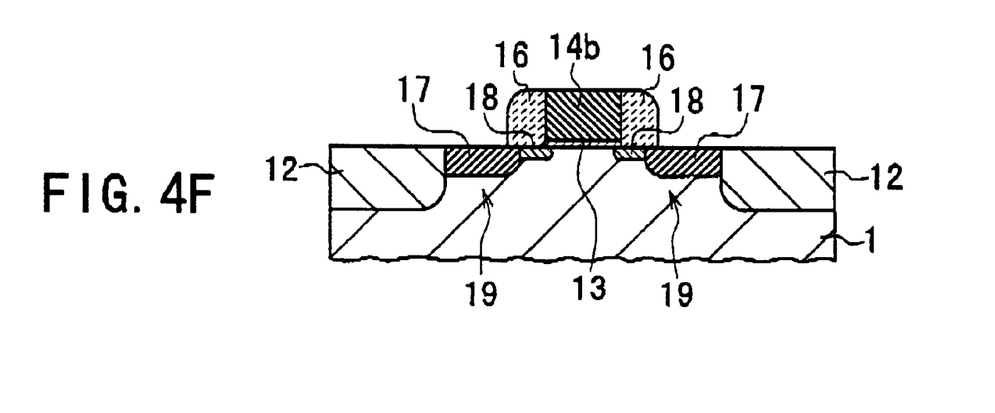

Through the above-described processes, a pair of source/drain regions 19 with a double drain structure were formed at each side of the gate electrode 14, as shown in FIG. 4F. Each of the pair of source/drain regions 19 was formed by the shallow boron-doped region 18 (e.g., 40 nm in depth) and the deep boron-doped region 17 (e.g., 100 to 200 nm in depth).

Although not shown here, with the semiconductor device fabricated in the above-identified processes, it was found that the enhanced diffusion phenomenon of the implanted boron atoms and the distribution of the implantation-induced point defects were able to be well controlled through the results of the inventors' tests.

In the above-described example, the ion-implantation of Ge for preamorphization is carried out prior to the ion-implantation of B. However, the ion-implantation of Ge (or, Si) for preamorphization may be carried out after to the ion-implantation of B as long as the amount of point defects induced in the substrate 1 by the ion-implantation step is minimized or decreased.

In the above-described example, B is ion-implanted into the Si substrate 1. However, it is needless to say that the present invention is not limited to this case. Any other dopant such as arsenic (As), phosphorus (P), and boron difluoride ($BF_2$) may be used for the present invention.

While the preferred examples of the present invention have been described, it is to be understood that modifications will be apparent to those skilled in the art without departing from the spirit of the invention. The scope of the invention, therefore, is to be determined solely by the following claims.

What is claimed is:

1. A fabrication method of semiconductor device, comprising the steps of:
   (a) forming a gate electrode over a main surface of single-crystal Si substrate of a first conductivity type through a gate insulating film;
   (b) ion-implanting a dopant of a second conductivity type opposite in polarity to said first conductivity type into said substrate at an acceleration energy of 1 keV or lower in self-alignment to said gate electrode under a condition that the amount of point defects induced in said ion-implanting step (b) is minimized or decreased, thereby forming first and second doped regions of said second conductivity type at each side of said gate electrode;
   (c) forming a pair of sidewall spacers on said substrate at each side of said gate electrode;
   (d) ion-implanting a dopant of said second conductivity type into said substrate in self-alignment to said pair of sidewall spacers, thereby forming third and fourth doped regions of said second conductivity type at each side of said gate electrode to be partially overlapped with said first and second doped regions, respectively, said third and fourth doped regions having a depth greater than that of said first and second doped regions and a lower dopant concentration than that of said first and second doped regions; and
   (e) heat-treating said substrate having the first, second, third and fourth doped regions of said second conductivity type for annealing, thereby constituting one of a pair of source/drain regions with a double drain structure by said first and third doped regions and the other thereof by said second and fourth doped regions wherein;
      (i) the main surface of said substrate is treated to form an amorphous region prior to or next to said ion-implanting step (d) to form said third and fourth doped regions; and
      (ii) a projected range of said dopant and a region having a doping concentration of $1 \times 10^{20}$ atoms/cm$^3$ or greater are included in said amorphous region; and
      (iii) a bottom of said point-defect region is located at a level lower than that of an interface between said amorphous region and said remaining single-crystal region of said substrate.

2. The method as claimed in claim 1, wherein said amorphous region formed at the main surface of said substrate contains vacancies only as crystal defects; and
   wherein said amorphous region is located in a point-defect region containing both interstitial atoms of Si and vacancy-type defects.

3. The method as claimed in claim 1, wherein boron is used as said dopant.

4. The method as claimed in claim 1, wherein arsenic is used as said dopant.

5. The method as claimed in claim 1, wherein phosphorous is used as said dopant.

6. The method as claimed in claim 1, wherein boron difluoride is used as said dopant.

7. A fabrication method of a semiconductor device, comprising the steps of:
   (a) forming a gate electrode over a main surface of a single-crystal Si substrate of a first conductivity type through a gate insulating film;
   (b) ion-implanting a dopant of a second conductivity type opposite in polarity to said first conductivity type into said substrate at an acceleration energy of 1 keV or lower in self-alignment to said gate electrode under a condition that the amount of point defects induced in said ion-implanting step (b) is minimized or decreased, thereby forming first and second doped regions of said conductive type at each side of said gate electrode;

(c) forming a pair of sidewall spacers on said substrate at each side of said gate electrode;

(d) ion-implanting a dopant of said second conductivity type into said substrate in self-alignment to said pair of sidewall spacers, thereby forming third and fourth doped regions of said second conductivity type at each side of said gate electrode to be partially overlapped with said first and second doped regions, respectively, said third and fourth doped regions having a depth greater than that of said first and second doped regions and a lower dopant concentration than that of said first and second doped regions; and (e) heat-treating said substrate having the first, second, third and fourth doped regions of said second conductivity type for annealing, thereby constituting one of a pair of source/drain regions with a double drain structure by said first and third doped regions and the other thereof by said second and fourth doped regions wherein;

(i) the main surface of said substrate is treated to form an amorphous region prior to or next to said ion-implanting step (d) to form said third and fourth doped regions; and (ii) a projected range of said dopant and a region having a doping concentration of $1 \times 10^{20}$ atoms/cm$^3$ or greater are included in said amorphous region; and (iii) a p-n junction defined by said point-defect region and said remaining single-crystal region of said substrate is located in said remaining single-crystal region of said substrate.

8. The method as claimed in claim 7, wherein:

(a) said amorphous region formed at the main surface of said substrate contains vacancies only as crystal defects; and (b) said amorphous region is located in a point-defect region containing both interstitial atoms of Si and vacancy-type defects.

9. The method as claimed in claim 7, wherein boron is used as said dopant.

10. The method as claimed in claim 7, wherein arsenic is used as said dopant.

11. The method as claimed in claim 7, wherein phosphorous is used as said dopant.

12. The method as claimed in claim 7, wherein boron difluoride is used as said dopant.

* * * * *